(12) United States Patent
Hofmeister (10) Patent No.: US 6,318,945 B1
(45) Date of Patent: *Nov. 20, 2001

(54) SUBSTRATE PROCESSING APPARATUS WITH VERTICALLY STACKED LOAD LOCK AND SUBSTRATE TRANSPORT ROBOT

(75) Inventor: Christopher A. Hofmeister, Hampstead, NH (US)

(73) Assignee: Brooks Automation, Inc., Chelmsford, MA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/362,490

(22) Filed: Jul. 28, 1999

(51) Int. Cl.$^7$ .................................................. B65G 65/00
(52) U.S. Cl. .................... 414/217; 414/416.08; 414/940; 414/939; 414/416.03; 118/719
(58) Field of Search ............................ 432/239; 118/719; 414/217, 935, 937, 939, 940, 941, 800, 805, 416.08, 416.03, 416.05

(56) References Cited

U.S. PATENT DOCUMENTS

| | | | |
|---|---|---|---|
| 5,431,529 | | 7/1995 | Eastman et al. ................ 414/744.5 |
| 5,512,320 | | 4/1996 | Turner et al. ...................... 427/255 |
| 5,515,986 | * | 5/1996 | Turlot et al. ................... 414/939 X |
| 5,562,383 | | 10/1996 | Iwai et al. ........................... 414/217 |
| 5,664,925 | * | 9/1997 | Muka et al. ................... 414/393 X |
| 5,720,590 | | 2/1998 | Hofmeister ...................... 414/744.2 |
| 5,772,386 | * | 6/1998 | Mages et al. .................. 414/939 X |
| 5,788,448 | * | 8/1998 | Wakamori et al. ............. 414/939 X |
| 5,855,681 | | 1/1999 | Maydan et al. .................... 118/719 |
| 5,882,413 | | 3/1999 | Beaulieu et al. ................... 118/719 |
| 5,909,994 | * | 6/1999 | Blum et al. .................... 414/939 X |
| 5,934,856 | * | 8/1999 | Asakawa et al. .............. 414/939 X |
| 5,964,561 | * | 10/1999 | Marohl .......................... 414/939 X |
| 6,042,623 | * | 3/2000 | Edwards ........................ 414/939 X |
| 6,048,154 | * | 4/2000 | Wytman ......................... 414/939 X |
| 6,053,686 | * | 4/2000 | Kyogoku ....................... 414/939 X |
| 6,053,688 | * | 4/2000 | Cheng ............................ 414/217 X |
| 6,074,154 | * | 6/2000 | Veda et al. ......................... 414/217 |

FOREIGN PATENT DOCUMENTS

WO97/48126   12/1997  (WO).

* cited by examiner

*Primary Examiner*—Frank E. Werner
(74) *Attorney, Agent, or Firm*—Perman & Green, LLP (57) ABSTRACT

A substrate processing apparatus substrate transport and load lock assembly comprising a first load lock, a first substrate elevator, and a transport robot. The substrate elevator has a first vertical drive and a first substrate support connected to the vertical drive. The support is vertically movable by the vertical drive along a path including a first position outside of the load lock and a second position inside the load lock. The transport robot has a movable arm for supporting at least one substrate thereon. The arm is movable into and out of the path while the support is located in the load lock.

6 Claims, 9 Drawing Sheets

SUBSTRATE PROCESSING APPARATUS WITH VERTICALLY STACKED LOAD LOCK AND SUBSTRATE TRANSPORT ROBOT

BACKGROUND OF THE INVENTION

1. Field of the Invention

The present invention relates to processing of substrate and, more particularly, to an assembly of a vertically arranged load lock and substrate transport robot assembly.

2. Prior Art

U.S. Pat. Nos. 5,562,383 and 5,882,413 disclose different types of substrate processing apparatus. It is known in the art to provide a substrate transport robot between a station holding a cassette of substrates and a load lock into a main transfer chamber of the substrate processing apparatus. A problem with this type of arrangement is that the footprint is relatively large because the cassette holding station, substrate transport robot and load lock are arranged in series along a horizontal plane.

SUMMARY OF THE INVENTION

In accordance with one embodiment of the present invention a substrate processing apparatus substrate transport and load lock assembly is provided comprising a first load lock, a first substrate elevator, and a transport robot. The first substrate elevator has a first vertical drive and a first substrate support connected to the vertical drive. The support is vertically movable by the vertical drive along a path including a first position outside of the load lock and a second position inside the load lock. The transport robot has a movable arm for supporting at least one substrate thereon. The movable arm is movable into and out of the path of the substrate support while the support is located in the load lock.

In accordance with another embodiment of the present invention a substrate processing apparatus substrate transport and load lock assembly is provided comprising a frame, a substrate elevator, and a transport. The frame has a first load lock chamber and a substrate pod receiving chamber vertically orientated relative to each other. The substrate elevator has a vertical drive and a first substrate support connected to the vertical drive. The support is vertically movable by the vertical drive between a position inside the first load lock chamber and a position inside the substrate pod receiving chamber. The transport has a movable arm for supporting a portable substrate pod thereon and for moving a portable substrate pod into and out of the substrate pod receiving chamber to transfer substrates between the substrate pod and the substrate support.

In accordance with another embodiment of the present invention a substrate processing apparatus substrate transport and load lock assembly is provided comprising a frame, a first substrate elevator, and a substrate transport robot. The frame has a first load lock chamber and a substrate transport robot chamber vertically orientated one above the other. The first substrate elevator has a vertical drive and a first substrate support connected to the vertical drive. The support is vertically movable by the vertical drive between a position inside the load lock chamber and a position inside the substrate transport robot chamber. The substrate transport robot has a movable arm assembly and an end effector connected to the movable arm assembly. The end effector is sized and shaped to support at least one substrate thereon. The movable arm assembly is located in the substrate transfer robot chamber. When the substrate support is located in the load lock chamber the movable arm assembly is movable in an area of the substrate transport robot chamber vertically offset and aligned, at least partially, with the substrate support.

In accordance with one method of the present invention a method of transporting substrates between a first load lock chamber and a portable substrate container is provided comprising steps of moving the substrates from the portable substrate container to a first substrate elevator. The substrate elevator having a first substrate support for directly individually supporting the substrates thereon, the substrate support being located in a receiving chamber vertically aligned with the load lock; and moving the substrate elevator to vertically move the substrate support from the receiving chamber into the load lock chamber, wherein the portable substrate container is directly connected to the receiving chamber while the substrates are moved from the container to the substrate elevator.

BRIEF DESCRIPTION OF THE DRAWINGS

The foregoing aspects and other features of the present invention are explained in the following description, taken in connection with the accompanying drawings, wherein.

DETAILED DESCRIPTION OF THE PREFERRED EMBODIMENTS

Figure 1:
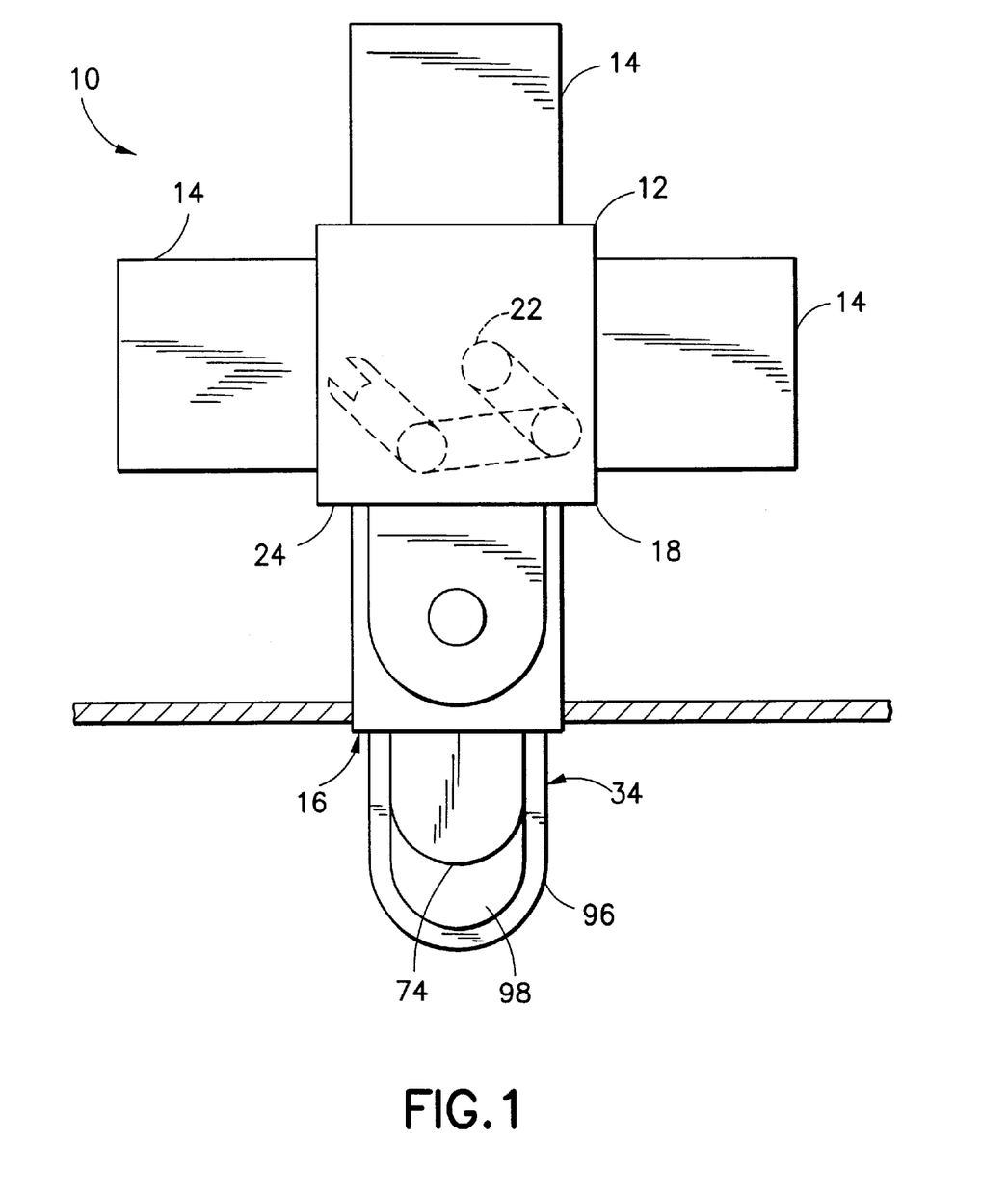
FIG. 1 is a schematic top view of a substrate processing apparatus comprising features of the present invention.

Referring to FIG. 1, there is shown a schematic top plan view of a substrate processing apparatus 10 incorporating features of the present invention. Although the present invention will be described with reference to the embodiments shown in the drawings, it should be understood that the present invention can be embodied in many alternate forms of embodiments. In addition, any suitable size, shape or type of elements or materials could be used.

Figure 2:
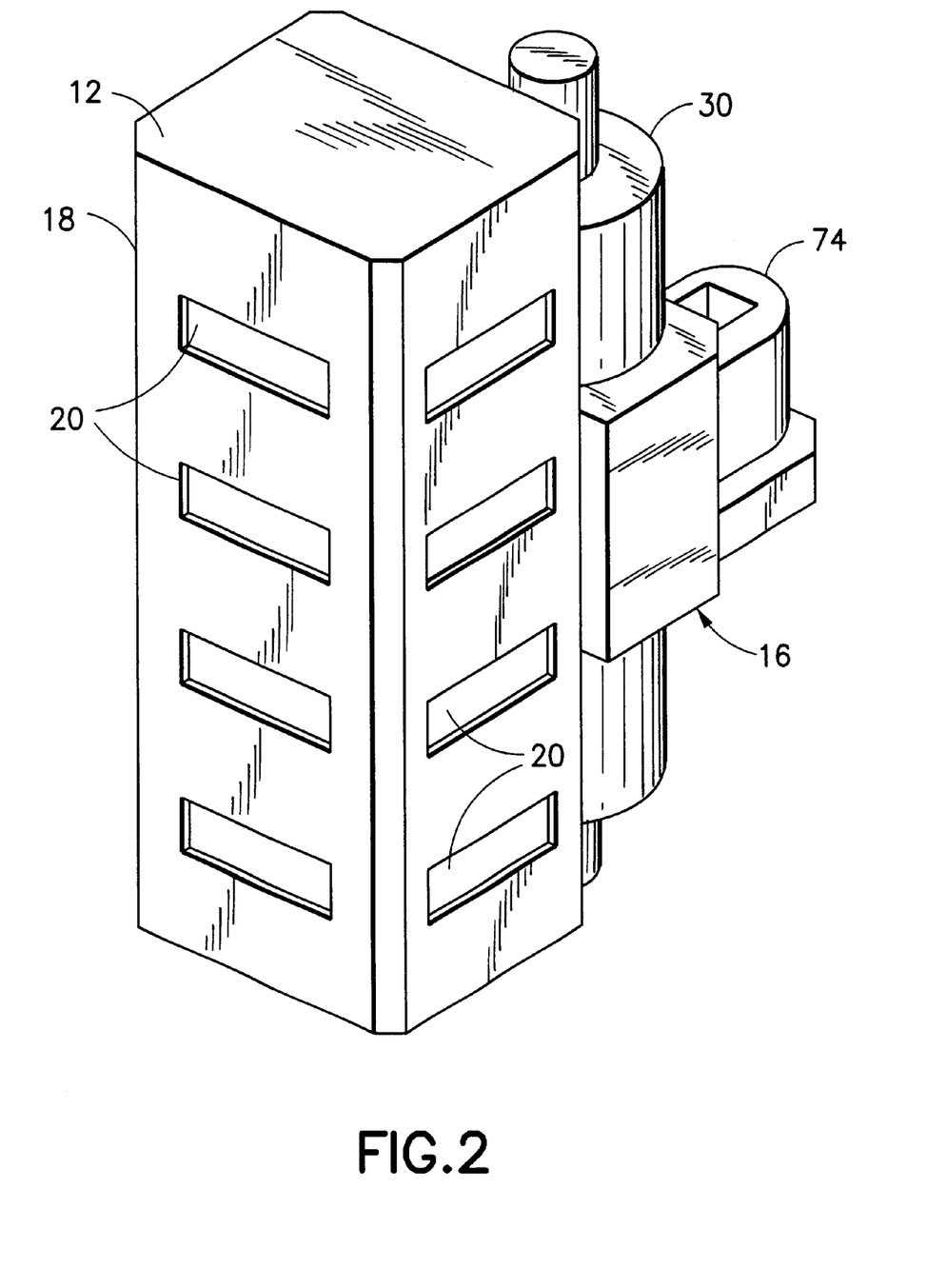
FIG. 2 is a perspective view of the apparatus shown in FIG. 1 without the substrate processing modules attached to the main transfer chamber.

The apparatus 10 generally comprises a main transfer chamber 12, substrate processing modules 14, and a substrate transport and load lock assembly 16. The chamber 12 is shown as having four sides, but in alternate embodiments the chamber could have any suitable shape with any suitable number of sides. The substrate processing modules 14 are well known in the art and are used for processing substrates such as semi-conductor wafers or flat panel display substrates. In this embodiment, the modules 14 are mounted to three sides of the chamber 12. In alternate embodiments the modules 14 could be mounted to more or less than three sides. The assembly 16 is mounted to the fourth side of the chamber 12. In alternate embodiments more than one assembly 16 could be provided and, could be mounted to one or more sides of the main transfer chamber. Referring also to FIG. 2, the chamber 12 has a frame 18 and vertically spaced apertures 20. The chamber 12 may be comprised of multiple chambers stacked or otherwise connected to each other; perhaps with a common frame or multiple frames. The processing modules 14 are mounted to the frame 18 at the apertures 20. Thus, vertical arrays or columns of modules 14 are attached to the frame 18. The chamber 12 also has a substrate transport robot 22 (see FIG. 1) located, at least partially, inside the frame 18 for transporting substrates into, through and out of the frame 18. Any suitable type of robot could be provided in the chamber 12, but it needs to be vertically movable to pass through the vertically spaced apertures 20. The chamber 12 could also have more than one robot located in main transfer area inside the frame 18. An example of one such robot is described in U.S. patent application Ser. No. 08/662,930, now U.S. Pat. No. 606,278 which is hereby incorporated by reference in its entirety. Although FIG. 2 shows columns of four apertures 20 on sides of the frame 18, more or less apertures could be provided on each side, the apertures 20 could be staggered on each side, and/or more than one column of apertures could be provided on a single side.

Figure 3:
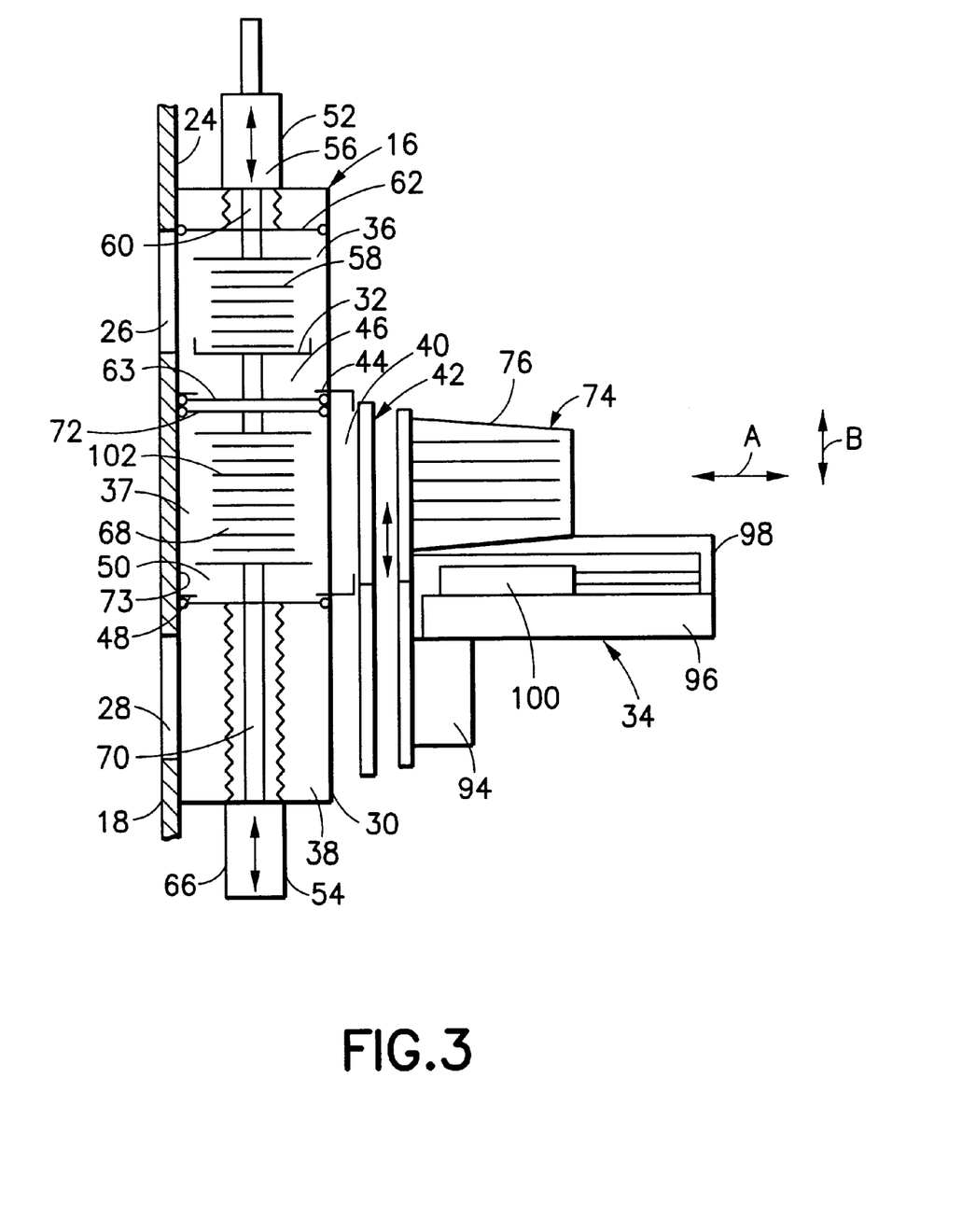
FIG. 3 is a schematic cross-sectional view of the substrate transport and load lock assembly shown in FIG. 2.

Referring also to FIG. 3, the substrate transport and load lock assembly 16 is connected to one side 24 of the frame 18. In this embodiment the side 24 has two vertically spaced apertures 26, 28. The assembly 16 generally comprises a frame 30, a substrate elevator 32, and a transport 34. The frame 30 has two apertures aligned with the apertures 26, 28. Movable doors (not shown) can be provided at the apertures 26, 28 either connected to the frame 18 or the frame 30. The frame 30 has three stacked areas 36, 37, 38. The top area 36 is located at the top aperture 26 and the bottom area 38 is located at the bottom aperture 28. In this embodiment the frame 30 has a ledge 44 with an aperture 46 therethrough located between the top and middle area 36, 37. The frame 30 also has a ledge 48 with an aperture 50 located between the middle and bottom areas 37, 38. The middle area 37 has an aperture 40 on an opposite side of the frame 30 from the apertures 26, 28. A movable door 42 is connected to the frame 30 for opening and closing the aperture 40.

The substrate elevator 32 is similar to the elevator disclosed U.S. patent application Ser. No. 09/049,314, now Pat. No. 6,059,507 which is hereby incorporated by reference in its entirety. In this embodiment the elevator 32 has two independently movable sections 52, 54. However, in an alternate embodiment a single elevator with multiple substrate receiving areas connected for unison vertical movement with each other could be used. The top elevator section 52 generally comprises a drive 56 and a substrate support 58. The substrate support 58 is adapted to separately support individual substrates thereon in a spaced configuration. The support 58 is connected to the drive 56 by a drive rod 60. The drive 56 can move the drive rod 60 vertically up and down to move the support 58 vertically up and down between positions in the top area 36 and the middle area 37. The top elevator section 52 also has two plates 62, 63 located on opposite top and bottom sides of the support 58. The top plate 62 makes a sealing engagement with a top side of the ledge 44 when the top elevator section 52 is in a down position with the support 58 in the middle area 37. The bottom plate 63 makes a sealing engagement with an underside of the ledge 44 when the top elevator section 52 is in an up position with the support 58 in the top area 36. In one embodiment the drive 56 can also axially rotate the rod 60 and, thus, rotate the support 58 and substrates thereon. The bottom elevator section 54 generally comprises a drive 66 and a substrate support 68. The substrate support 68 is adapted to separately support individual substrates thereon in a spaced configuration. The support 68 is connected to the drive 66 by a drive rod 70. The drive 66 can move the drive rod 70 vertically up and down to move the support 68 vertically up and down between positions in the bottom area 38 and the middle area 37. The bottom elevator section 54 also has two plates 72, 73 located on opposite top and bottom sides of the support 68. The top plate 72 makes a sealing engagement with a top side of the ledge 48 when the bottom elevator section 54 is in a down position with the support 68 in the bottom area 38. The bottom plate 73 makes a sealing engagement with an underside of the ledge 48 when the bottom elevator section 54 is in an up position with the support 68 in the middle area 37. In one embodiment the drive 66 can also axially rotate the rod 70 and, thus, rotate the support 68 and substrates thereon.

The top area 36 and the bottom area 38 provide the function of being load lock chambers between the main chamber inside the frame 18 and the middle area 37. The top and bottom areas 36, 38 are preferably connected to a source of vacuum to evacuate air from inside the areas 36, 37. When the top substrate support 58 is in the top area 36 the robot 22 (see FIG. 1) can move substrates through the aperture 26 onto and off of the support 58. When the bottom substrate support 68 is in the bottom area 38 the robot 22 can move substrates through the aperture 28 onto and off of the support 68. The middle area 37 forms a receiving area for loading substrates from a portable substrate container 74, also known as a carrier or pod, onto and off of the substrate supports 58, 68 when the supports 58, 68 are located in the middle area 37. In a preferred embodiment the plates 63, 72 are larger than their respective related plates 62, 73 to take advantage of atmospheric pressure in the middle area 37 when the top and bottom areas 36, 38 have pressures less than atmospheric pressure to maintain seals at apertures 46, 50 by the plates 62, 73.

Figure 4:
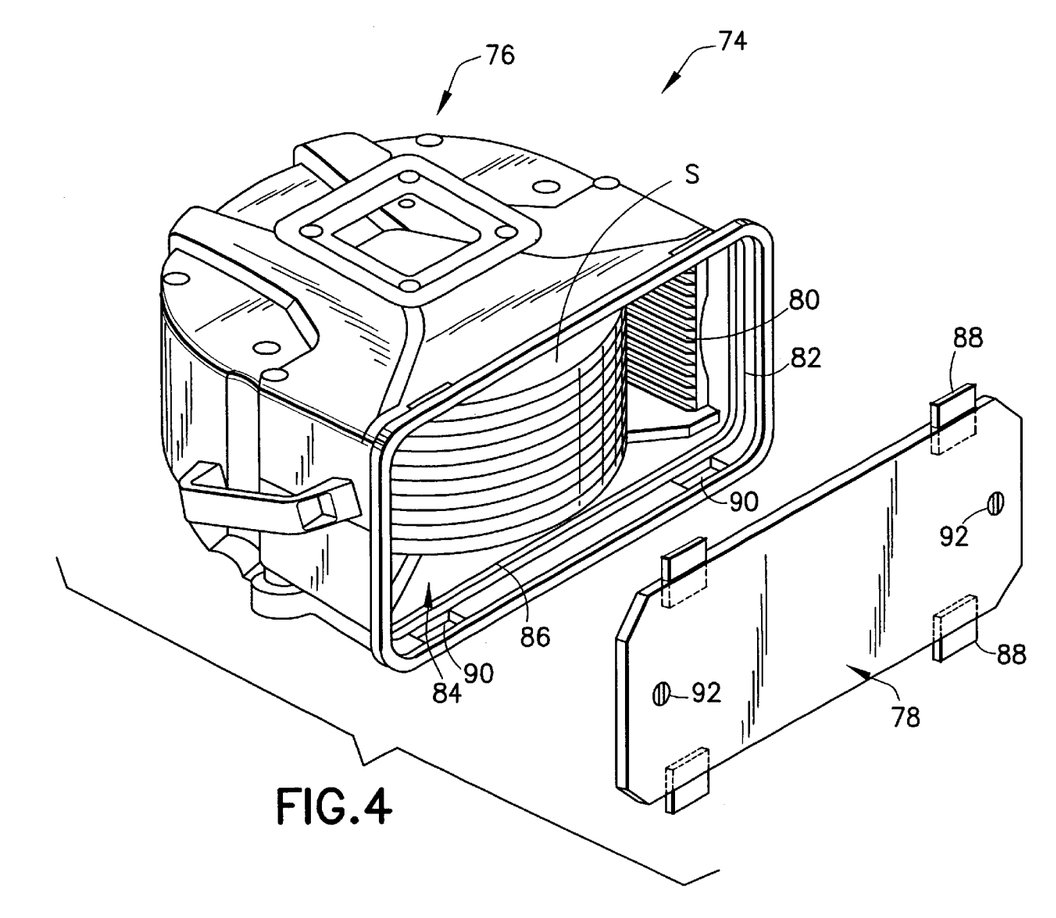
FIG. 4 is an exploded perspective view of the portable substrate container shown in FIG. 3.

Referring also to FIG. 4, an exploded perspective view of one embodiment of a portable substrate container 74 is shown. The container 74 has a main housing 76 and a removable side door 78. The container 74 is similar to that described in U.S. patent application Ser. No. 09/243,516, now Pat. No. 6,120,229 which is hereby incorporated by reference in its entirety. The container 74 is a FOUP (Front Opening Unified Pod) design for supporting and transporting a plurality of wafers in spaced relationship in a substantially particle free environment. The container 74 has a plurality of rack members 80 for supporting the wafers generally horizontally, in a generally vertically spaced relationship. At any one time, all or only some of the rack members 80 may actually be supporting wafers. In alternate embodiments other types of portable substrate holders could be used.

The container 74 includes the housing 76 with a carrier port 82 for providing access to the interior 84 thereof. A carrier door 78 is removably connected to the housing 76 and is movable between a closed position overlying the carrier port 82 and an open position spaced from the carrier port 82. The carrier door 78 is illustrated as including a generally rectangular plate and has a peripherally extending continuous raised flange. A suitable seal 86 is interposed between the flange and the carrier port for sealing the interior of the carrier 74 from the surrounding atmosphere when the carrier door is in the closed position. For selectively locking the carrier door 78 in place overlying the carrier port 82 and with the flange firmly engaged with the seal 86, a plurality of latch members 88 are provided on the carrier door at peripherally spaced locations movable between an extended, locking position so as to be engaged with respectively positioned locking recesses 90 on the carrier adjacent the carrier port and a retracted release position disengaged from the locking recesses 90. Suitable keyway mechanisms externally indicated by latch keyways 92 are operably connected to the latch members 88 for moving the latch members between the locking position and the release position. The mechanisms (not shown) may be linkages or may be solenoid operated of may be of other appropriate design. In a typical manner, when the latch keyways 92 are vertically oriented the latch members 38 are extended such that the carrier door is closed and locked with the flange bearing firmly against the carrier port 82 with the seal 86 interposed between the flange and the port to maintain the particle free environment within the interior 84 of the carrier. When the latch keyways 92 are horizontally oriented the latch members 88 are retracted such that the carrier door is unlocked and capable of being removed from the carrier port 82. In this latter condition, the carrier door 78 is free to be removed from the carrier in a manner to be described below.

Referring back to FIG. 3, the transport 34 generally comprises a carrier door opener 94, a support frame 96, a movable arm 98, and a drive 100 for moving the movable arm 98. The carrier door opener 94 is connected to the support frame 96 and is adapted to remove and replace the door 78 with the main housing 76 of the portable container 74 as described in U.S. patent application Ser. No. 09/243, 516. The movable arm 98 is adapted to have the container 74 removably mounted thereon. The drive 100 is adapted to horizontally move the arm 94 to move the main housing 76 of the container 74 relative to the support frame 96, as indicated by arrow A, through the aperture 40 into and out of the middle chamber 37 of the assembly 16. The drive 100 is preferably also able to slightly move the arm 98 vertically up and down when the main housing 76 is in the middle chamber 37 as indicated by arrow B. Of course, the movable door 42 must be out of the way of the aperture 40 for the arm 98 and main housing 76 of the container 74 to move in and out of the middle chamber 37.

The container 74, with substrates therein, is initially placed on the arm 98 by an operator. The door 78 is then removed from the main housing 76 by the opener 94. The door 42 is opened and the arm 98 is moved to move the main housing 76 into the middle chamber 37. One of the substrate supports 58 or 68 is located in the middle chamber 37 with plates 62, 72 or 63, 73 sealing off the middle chamber 37 from top and bottom load lock chambers 36, 38. The substrates S in the main housing 76 are moved into position over individual substrate support shelves 102 of the support 58 or 68. The substrates S are then vertically moved onto the shelves 102 off of the rack members 80 by merely moving the main housing 76 downward. The arm 98 is then retracted back to the position shown in FIG. 3 to withdraw the main housing 76 from the middle chamber 37. The door 42 is moved to a closed position to close the aperture 40. The middle chamber 37 can be evacuated before moving the substrate support and substrates thereon. If the upper substrate support 58 was in the middle chamber 37, it is moved up into the upper load lock chamber 36 with the plate 63 being sealed against the ledge 44. The robot 22 (see FIG. 1) can then move the substrates from and to the support 58 while in the top load lock chamber 36. If the lower substrate support 68 was in the middle chamber 37, it is moved down into the lower load lock chamber 38 with the plate 72 being sealed against the ledge 48. The robot 22 can then move the substrates from and to the support 68 while in the bottom load lock chamber 38.

Once the unprocessed substrates are removed from the supports 58, 68 and replaced with processed substrates from the processing modules 14 (see FIG. 1) the supports 58, 68 can be separately returned to the middle chamber 37, the door 42 opened and the main housing 76 is inserted into the middle chamber 37 again by the arm 98. The main housing 76 is moved upward in the middle chamber 37 to remove the substrates from the shelves 102 and now support the substrates on the rack members 80. The arm 98 is then moved to remove the main housing 76 from the middle chamber 37 with the processed substrates in the main housing 76. The door 42 is closed. The door 78 is replaced onto the main housing 76. The operator can now replace the container 74 with a new container of new substrates to be processed to repeat the process.

With the present invention the footprint of the apparatus 10, when compared to prior art substrate processing apparatus, can be reduced. More specifically, the present invention allows the load lock chamber between the environment in the main transfer chamber 12 and the environment outside the chamber 12 to be vertically aligned, at least partially, with at least a portion of the robot(s) used to transfer the substrates from the initial portable substrate container placement area to the load lock chamber(s). In the prior art, such as disclosed in U.S. Pat. No. 5,512,320 the robot in the atmospheric exchange section was located totally horizontally outward from the load locks. This increased the footprint of the processing apparatus. The present invention significantly reduces the size of the atmospheric exchange section by vertically stacking a part of the atmospheric exchange section with the load lock chamber(s) and vertically stacking a part of the robot of the atmospheric exchange section with the portable substrate container 74.

Figure 5:
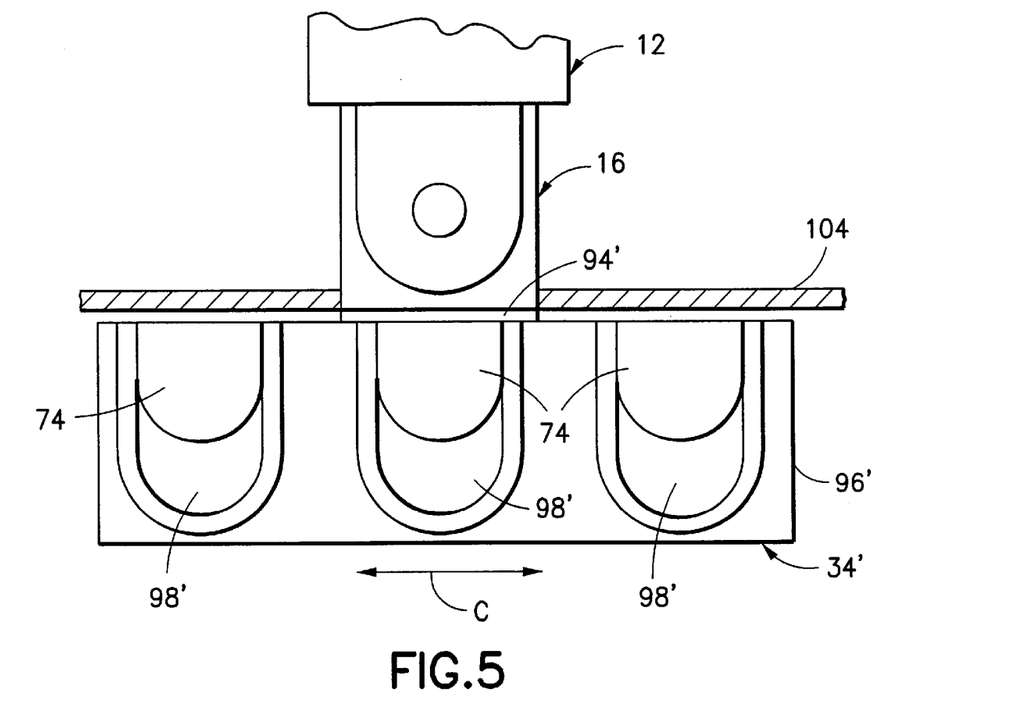
FIG. 5 is a schematic top plan view of an alternate embodiment of the portable substrate container movement device.

FIG. 5 shows a schematic top plan view of an alternate embodiment of the transport 34'. The transport 34' has a frame 96', a carrier door opener 94', three movable arms 98' each having a separate drive (not shown). The frame 96' is automatically or robotically movable relative to the assembly 16 outside the clean room wall 104 as indicated by arrow C. This allows the containers 74 and arms 98' to be separately brought into registry with the door opener 94' and assembly 16 for interaction therewith. The two other areas not in registration with the door opener 94' and assembly 16 can be used by the operator to load and unload the containers 74 on the arms 98'.

Figure 6:
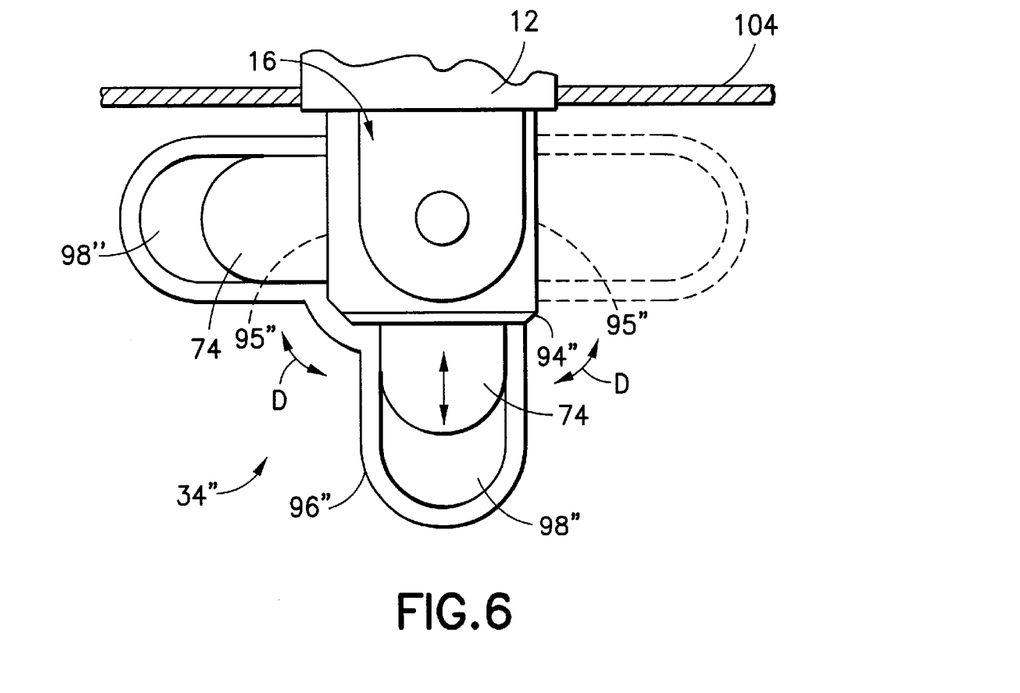
FIG. 6 is a schematic top plan view of another alternate embodiment of the portable substrate container movement device.

FIG. 6 shows a schematic top plan view of another alternate embodiment of the transport 34". In this embodiment the transport has a frame 96", a carrier door opener 94" and two movable arms 98". The frame 96" can be rotated as indicated by arrows D to move the containers 74 into and out of registry with the door opener 94" for introduction of the containers 74 into the assembly 16. In an alternate embodiment the transport 34" could have two lateral side carrier door openers at locations 95" wherein the containers 74 would be loaded on one of the movable arms 98" when the movable arm was located in a front position and the substrates and/or container moved into the assembly 16 when moved to either lateral side of the assembly 16.

Figure 7:
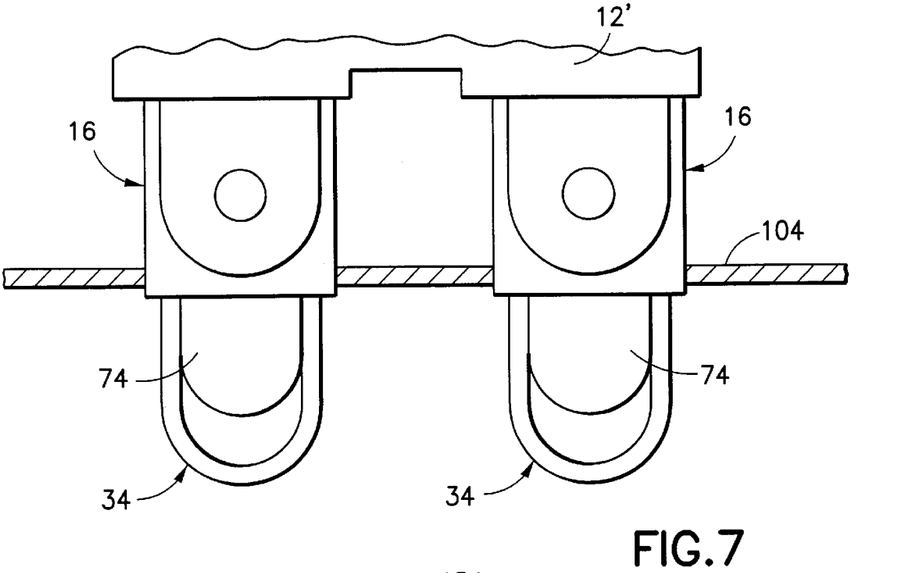
FIG. 7 is a schematic top plan view of another alternate embodiment having two substrate transport and load lock assemblies.

FIG. 7 shows a schematic top plan view of another alternate embodiment. In this embodiment the substrate processing apparatus has two assemblies 16 attached to the main transfer chamber 12'. Each assembly 16 has its own transport 34 for moving separate containers 74 into and out of the separate assemblies 16.

Figure 8:
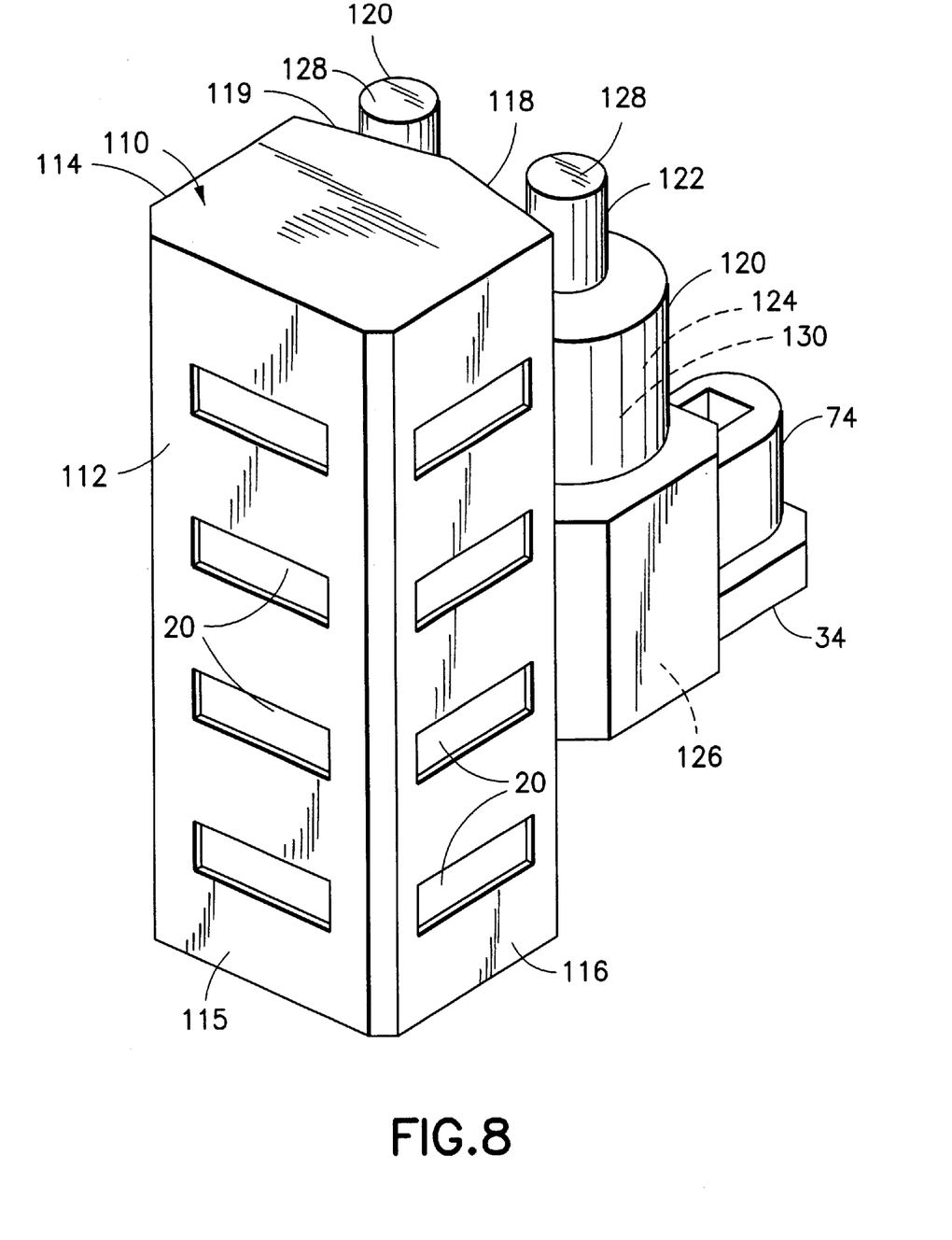
FIG. 8 is a perspective view as in FIG. 2 of another alternate embodiment of the main transfer chamber and two substrate transport and load lock assemblies.

Referring now to FIG. 8 a schematic perspective view, similar to FIG. 2, of an alternate embodiment is shown. The frame 112 of the main transfer chamber 110 has three sides 114, 115, 116 with apertures 20 for mounting the substrate process modules 14 in vertically columns. The frame 112 also has two other sides 118, 119 having two assemblies 120 separately mounted to each side 118, 119. The assemblies 120 are substrate transport and load lock assemblies similar to the assemblies 16. However, the assemblies 120 each only comprise one elevator section 122 rather than two elevator sections and one load lock chamber 124 rather than two load lock chambers. For each assembly 120, the transport 34 is able to move the container 74 into and out of its receiving chamber 126. The drives 128 and respective substrate supports 130 are able to move the substrates between their respective chambers 124, 126.

Figure 9:
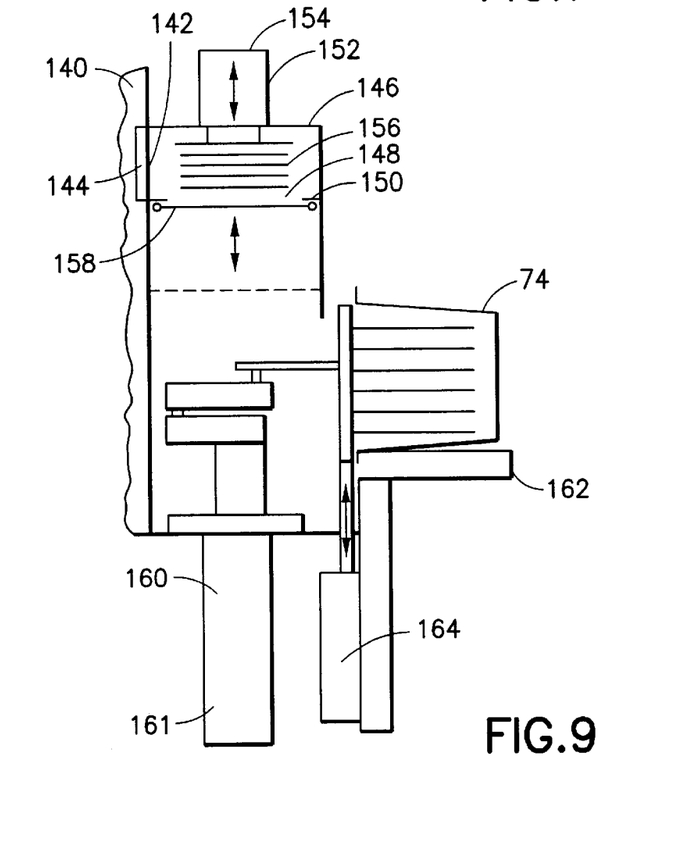
FIG. 9 is a schematic cross-sectional view of another embodiment of a substrate transport and load lock assembly.
Figure 10:
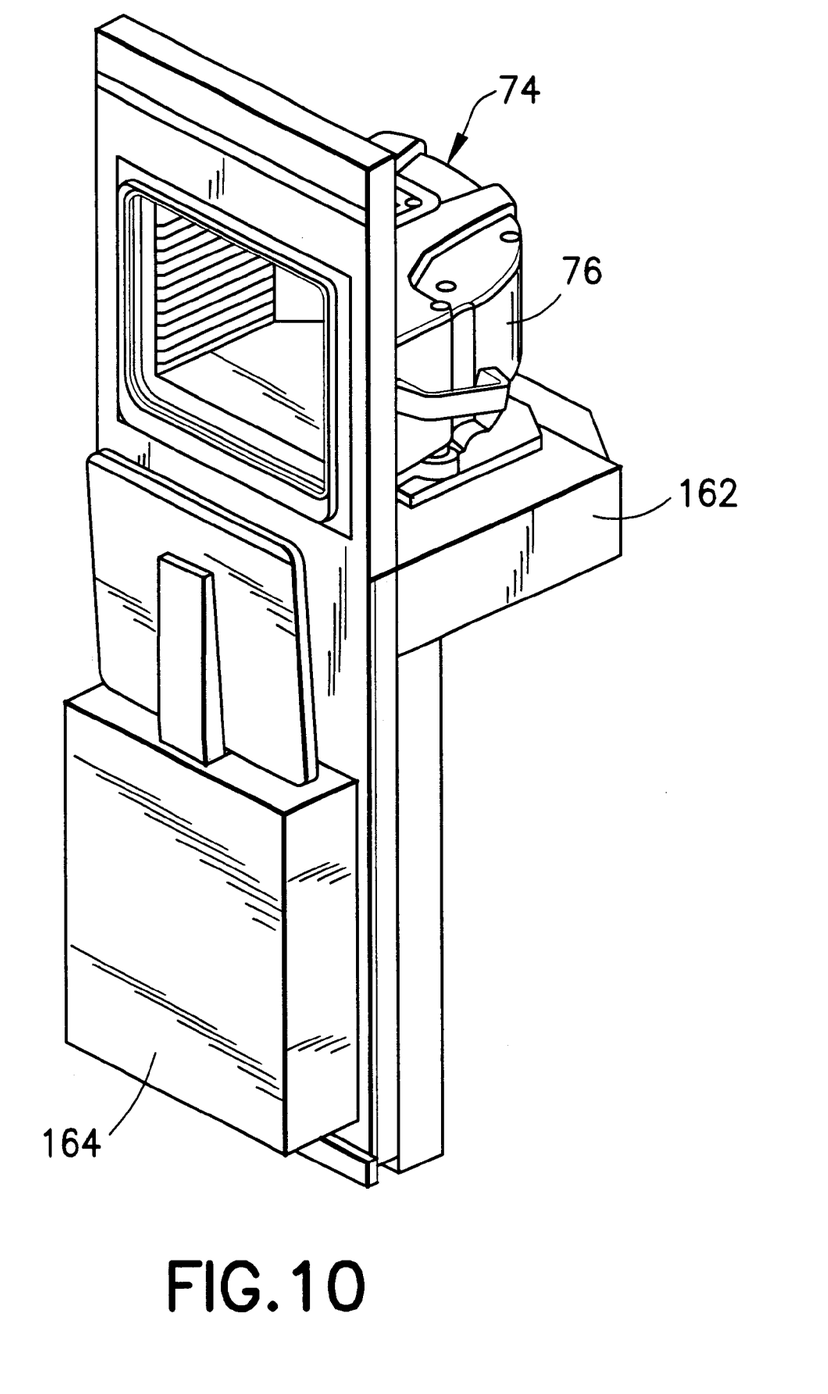
FIG. 10 is a perspective view of the portable substrate container support and door opener of the assembly shown in FIG. 9.

Referring now to FIG. 9, another alternate embodiment will be described. In this embodiment the substrate processing apparatus has a main transfer chamber 140 with two laterally spaced entrance apertures 142 (only one of which is shown). A door 144 is located at each aperture 142 for selectively sealing the aperture. A load lock chamber 146 is connected to the chamber 140 at each aperture 142. Each load lock chamber 146 has a bottom aperture 148 with a ledge 150. An elevator 152 is provided with each load lock chamber 146 having a drive 154 and a multi-substrate holder 156 connected to the drive 154. The drive 154 is adapted to vertically move the holder 156 into and out of the chamber 146. The elevator 152 has a bottom plate 158 which can contact the ledge 150 to seal off the chamber 140 when the elevator is in an up position. Located vertically spaced from the load lock chambers 146 is a robot 160 for moving substrates between the portable substrate container 74 and the substrate holders 156 when the holders are in a down position. One such robot is described in U.S. Pat. No. 5,720,590 and another in U.S. Pat. No. 5,431,529 which are hereby incorporated by reference. However, any suitable robot could be used. Referring also to FIG. 10, the portable container 74 is positioned on a frame 162. A door opener 164 is connected to the frame 162 to remove the door to the container 74. The main housing 76 remains stationary on the frame 162 as the robot 160 moves the substrates into and out of the main housing 76. The load lock chambers 146 and the drive 161 of the robot 160 are contained in a same vertical plane which does not intersect the main transfer chamber 140 or containers 74. Thus, the footprint of the assembly 146, 152, 160 and the horizontal distance between the containers 74 and entrance to the chamber 140 is smaller than in the prior art.

Figure 11:
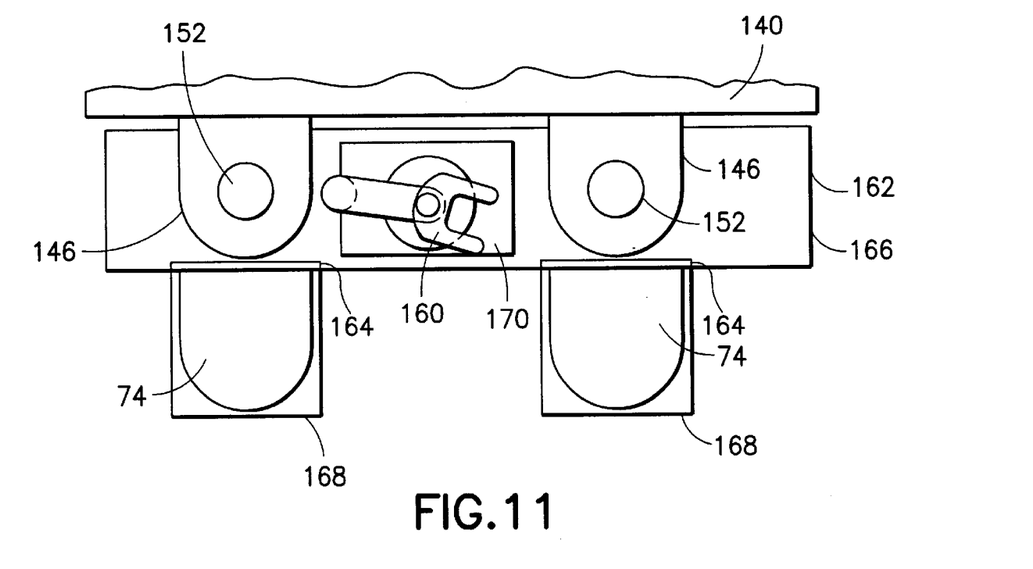
FIG. 11 is a schematic top plan view of an alternate embodiment of the substrate transport and load lock assembly.
Figure 12:
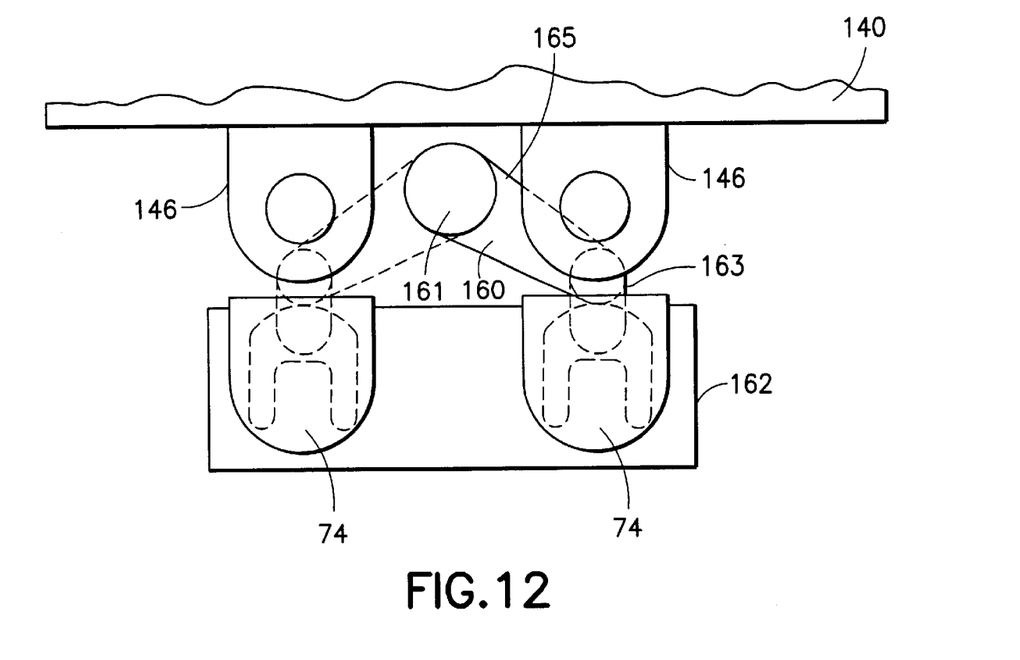
FIG. 12 is a schematic top plan view of another alternate embodiment of the substrate transport and load lock assembly.

FIGS. 11 and 12 show two different adaptations using this type of principle. In FIG. 11 the main transfer chamber 140 has two load lock chambers 146 attached to it. Each load lock chamber 146 has its own separate elevator section 152. The frame 162 includes a track section 166, and two container support areas 168. The containers 74 can be mounted on the support areas 168. Each support area 168 has a separate door opener 164 associated therewith. The robot 160 is mounted on a car 170. The car 170 is movably mounted on the track 166. A similar car/track configuration is disclosed in U.S. patent application Ser. No. 08/891,523, now U.S. Pat. No. 6,139,245 which is hereby incorporated by reference. However, any suitable horizontal traverse robot relocation system could be used. The robot 160 can move under the load lock chambers 146.

In FIG. 12 the robot drive 161 is not moved from the relative position shown. Instead, the robot 160 uses a scara arm with an off-center pick technique similar to that described in U.S. patent application Ser. No. 09/163,844 which is hereby incorporated by reference. The arms 163 of the robot 160, including the proximal or upper arm 165, can move under the load lock chambers 146.

It should be understood that the foregoing description is only illustrative of the invention. Various alternatives and modifications can be devised by those skilled in the art without departing from the invention. Accordingly, the present invention is intended to embrace all such alternatives, modifications and variances which fall within the scope of the appended claims.

What is claimed is:

1. A substrate processing apparatus having a main process transport chamber and an assembly for transporting substrates into and out of said main process transport chamber, said transport assembly comprising:

a first housing enclosing a first sealed load lock chamber, said housing mounted to a frame of said main process transport chamber and having an opening to allow communication between said load lock chamber an d said main process transport chamber;

a second housing enclosing a load/unload chamber mounted in a position vertically adjacent to said first load lock chamber and having an opening for communication between said load lock chamber and said load/unload chamber, said load/unload chamber having a further closable access portal;

a third housing enclosing a second sealed load lock chamber mounted vertically adjacent to said load/unload chamber said housing mounted to said frame of said main process transport chamber and having an opening to allow communication between said second load lock chamber and said main process transport chamber;

an elevator having a first and second racks for supporting a plurality of substrates, said elevator mounted for vertical movement in said first, second, and third housings between a position wherein said first rack is in said first load lock chamber and said second rack is in said load/unload chamber and a position wherein said second rack is in said second load lock chamber and said first rack is in said load/unload chamber;

a process transporter mounted within the main process transport chamber for moving substrates into and out of said first and second load lock chambers; and a load/unload transporter mounted adjacent said load/unload chamber portal for opening said portal and moving substrates into and out of said load/unload chamber.

2. A substrate processing apparatus having a main process transport chamber and an assembly for transporting substrates into and out of said main process transport chamber, as described in claim 1 wherein said first and second racks are equipped with upper and lower sealing plates which engage the housing of the first and second load lock chambers to seal said load lock chambers.

3. A substrate processing apparatus having a main process transport chamber and an assembly for transporting substrates into and out of said main process transport chamber, as described in claim 1, further comprising a drive operatively connected to said elevator to move said elevator between its two positions.

4. A substrate processing apparatus having a main process transport chamber and an assembly for transporting substrates into and out of said main process transport chamber, as described in claim 1, wherein said first and second racks are independently mounted and have independent drives for sequentially moving said racks between positions into and out of said load lock chambers and said load/unload chamber.

5. A substrate processing apparatus having a main process transport chamber and an assembly for transporting substrates into and out of said main process transport chamber, as described in claim 1, wherein said process transporter is a robot arm operable to remove and insert substrates from and to said racks when said racks are in said load lock chambers.

6. A substrate processing apparatus having a main process transport chamber and an assembly for transporting substrates into and out of said main process transport chamber, as described in claim 1, wherein said load/unload transporter is constructed with a portable substrate container, said substrate container comprising:

a housing defining a container having an opening therein to receive a plurality of substrates;

a plurality of shelves for supporting said plurality of substrates;

a door for opening and closing said opening of the container; and wherein said load/unload transporter supports said portable substrate container and moves said container into engagement with said load/unload chamber so that said substrate container opening aligns with said load/unload chamber portal to allow the transfer of substrates to or from said container.

* * * * *